United States Patent [19]

Kuo

[11] 4,390,971
[45] Jun. 28, 1983

[54] POST-METAL PROGRAMMABLE MOS READ ONLY MEMORY

[75] Inventor: Chang-Kiang Kuo, Houston, Tex.

[73] Assignee: Texas Instruments Incorporated, Dallas, Tex.

[21] Appl. No.: 284,847

[22] Filed: Jul. 20, 1981

Related U.S. Application Data

[62] Division of Ser. No. 890,555, Mar. 20, 1978.

[51] Int. Cl.³ .................................................. G11C 11/40
[52] U.S. Cl. ........................................ 365/104; 365/51
[58] Field of Search .................. 365/174, 182, 184, 51, 365/104, 105

[56] References Cited

U.S. PATENT DOCUMENTS 4,328,563  5/1982  Schroeder ........................... 365/104

Primary Examiner—Terrell W. Fears
Attorney, Agent, or Firm—John G. Graham

[57] ABSTRACT

An MOS read only memory or ROM is formed by a process compatible with standard N-channel silicon gate manufacturing methods. The ROM is programmed after the top level of contacts and interconnections, usually metal, has been deposited and patterned. Address lines and gates are polysilicon, and output and ground lines are defined by elongated N+ regions. Each potential MOS transistor in the array is programmed to be a logic "1" or "0" by ion implanting through the polysilicon gates and thin gate oxide, using patterned protective oxide as a mask, or using photoresist as a mask prior to application of protective oxide.

1 Claim, 11 Drawing Figures

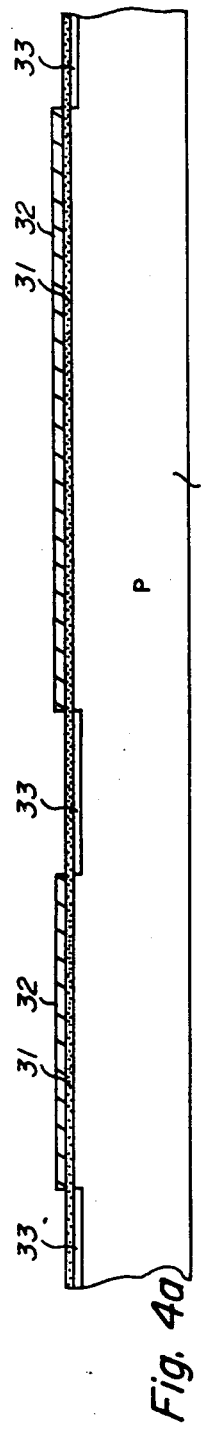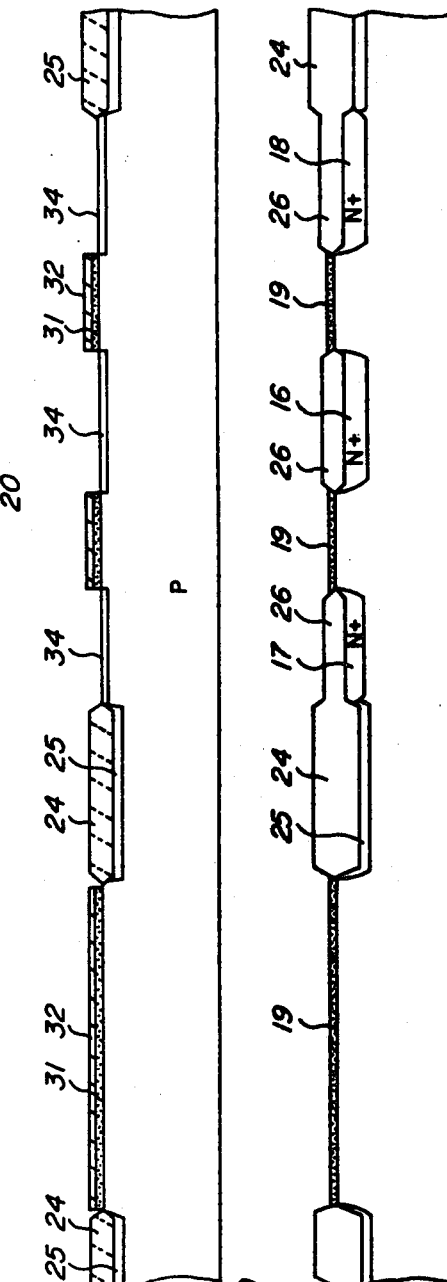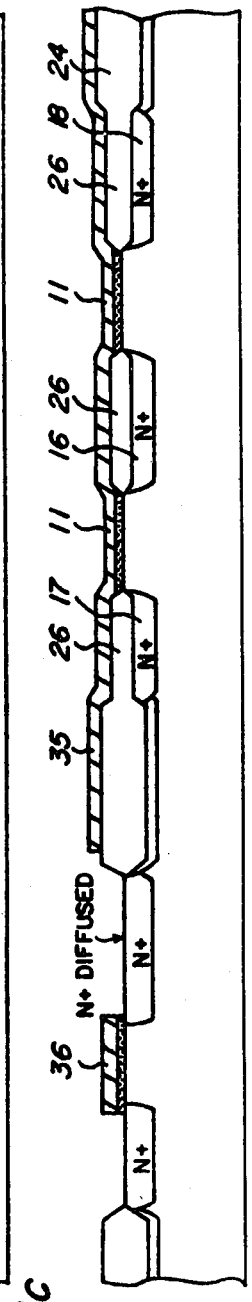
Fig. 4a  Fig. 4b  Fig. 4c  Fig. 4d

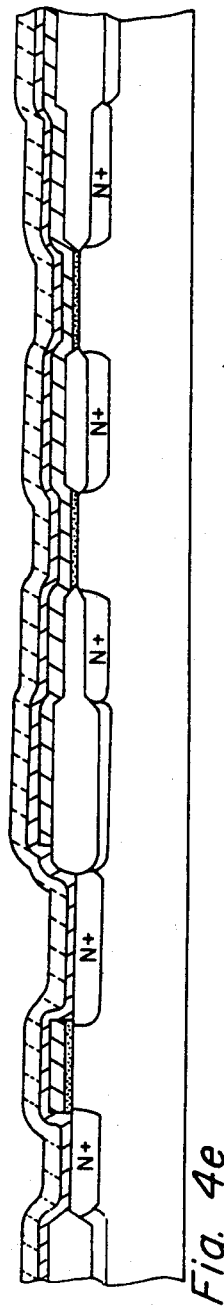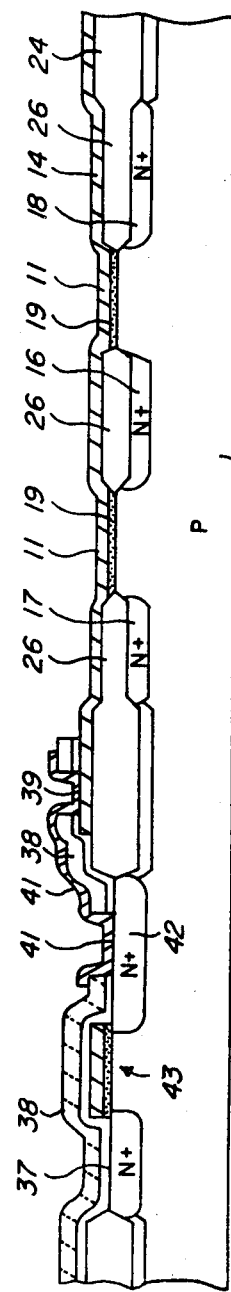
Fig. 4e
Fig. 4f

POST-METAL PROGRAMMABLE MOS READ ONLY MEMORY

This is a division of application Ser. No. 890,555, filed Mar. 20, 1978.

BACKGROUND OF THE INVENTION

This invention relates to semiconductor memory devices, and more particularly to an N-channel silicon gate MOS read only memory and a process for making it.

Semiconductor memory devices are widely used in the manufacture of digital equipment such as minicomputers and microprocessor systems. Storage of fixed programs is usually provided in these systems by MOS read only memory devices or "ROMs". ROMs are made by semiconductor manufacturers on special order, the programming code being specified by the customer. The manufacturing process is lengthy, requiring dozens of steps, each taking up time and introducing materials handling and inventory factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 762,612, filed Jan. 29, 1977 and Ser. No. 701,932, filed July 1, 1976, assigned to Texas Instruments. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip.

It is the principal object of this invention to provide a semiconductor permanent store memory cell of small size which may be programmed at a late stage in the manufacturing process. Another object is to provide a small-area MOS ROM cell which is made by a process compatible with standard N-channel silicon gate manufacturing techniques and is programmable after the metal interconnections have been applied and patterned.

SUMMARY OF THE INVENTION

In accordance with an embodiment of the invention, a metal-oxide-semiconductor read only memory, or MOS ROM, is formed in an integrated circuit along with other silicon gate transistors for the peripheral circuitry. The ROM is an array of potential MOS transistors where polysilicon strips on a silicon bar define the address lines and gates, and output and ground lines are defined by elongated N+ regions. In the array, each potential MOS transistor is a storage cell, each cell being programmed to store a logic "1" or "0" by ion implanting through the thin gate oxide and polysilicon address line which forms the gate. This ion implant step is done after the metal contacts and interconnects for the peripheral circuitry have been patterned. Protective oxide or photoresist can be used as the implant mask.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a–4f are elevation views in section of the ROM array and a transistor in the peripheral part of the semiconductor device of FIGS. 1 and 3a–3d, at successive stages in the manufacturing proces, taken generally along the line a-a in FIG. 1.

DETAILED DESCRIPTION OF SPECIFIC EMBODIMENTS

Figure 1:
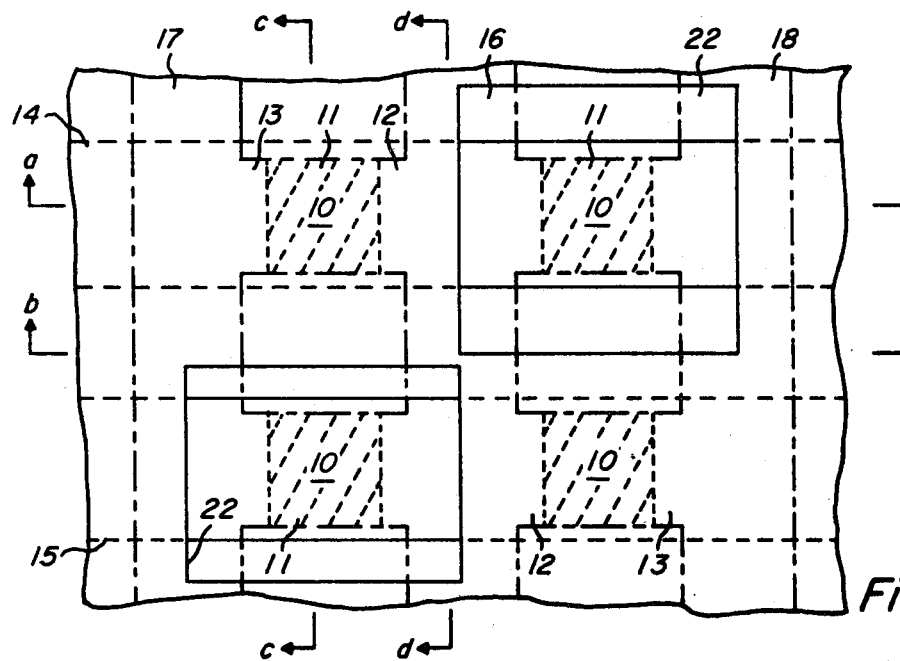
FIG. 1 is a greatly enlarged plan view of a small portion of a semiconductor chip showing the physical layout of a part of a ROM array made according to the invention.
Figure 2:
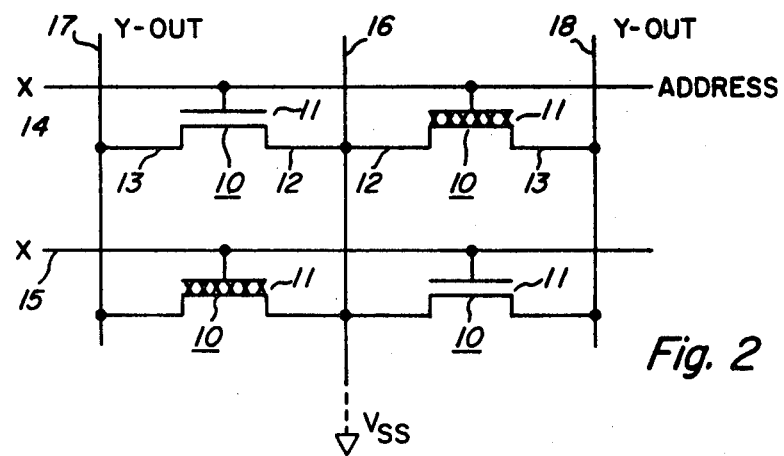
FIG. 2 is an electrical schematic diagram of the ROM of FIG. 1.

With reference to FIGS. 1, 2, and 3a–3d, a read only memory is illustrated which is programmed according to the invention. The array consists of a large number of cells 10, only four of which are shown. Each cell is an MOS transistor having a gate 11, a source 12 and a drain 13. The gates 11 are parts of polysilicon strips 14 and 15 which are the X address lines for the array. The sources are part of an N+ diffused region 16 which is connected to ground or Vss, while the drains are part of N+ diffused regions 17 and 18 which are Y output lines. The array, formed on a silicon bar 20, would typically contain perhaps 64K, 128K or 256K cells, so the bar would be less than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 and 256 of the Y lines like the lines 17 and 18, providing 65,536 bits. Although one Vss line 16 is shown for two Y lines, the array could be of a virtual ground type as disclosed in U.S. Pat. No. 3,934,233, issued to Roger J. Fisher and Gerald D. Rogers or U.S. Pat. No. 4,021,781 issued to Edward R. Caudel both assigned to Texas Instruments, in which case one Vss line for each eight or sixteen Y lines would be all that would be needed. Alternatively, the array could be of a virtual ground type wherein no dedicated ground lines are used, but instead one Y line is selected as ground, depending upon the Y address.

The cell array is programmed by boron implant through the polycrystalline silicon strips 14 and 15 and the gate oxide 19 to raise the threshold voltage of selected ones of the cells 10 to a value above that which will be turned on by the voltage on the selected address line 14, 15, etc. In the example of four cells shown, the upper right cell and the lower left cell are implanted in this manner, the others are not. A thick protective oxide layer 21 is used as the implant mask, with aperatures 22 etched in the layer 21 above the cells 10 which are to be implanted. The layer 21 is non-thermal oxide deposited at low temperature in accord with standard MOS manufacturing methods. Usually this oxide covers everything except the bonding pads on a bar. The ion implant creates implanted regions 23 in the channel areas of the selected transistors 10. The regions 23 are doped more heavily P-type than the original silicon substrate 20.

A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17, 18. No metal lines are used in the cell array, only in the peripheral areas.

Turning now to FIGS. 4a-4f, a process for making the ROM array of the invention will be described. The right hand side of these figures corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the -100- plane, of a resistivity of about 6 to 8 ohm-cm. As above, in the FIGURES the portion shown of the bar 20 represents only a very small part of the slice, perhaps 1 or 2 mils wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 19, but usually the layer is later removed and new gate oxide grown. Next, a layer 32 of silicon nitride of about 1000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

The next step in the process is formation of field oxide 24, which is done by subjecting the slices to steam or an oxidizing atmosphere at about 900 degrees C. for perhaps five hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the slice is again subjected to a nitride etchant which removes the parts of the nitride layer 32 now exposed by holes in the photoresist. The parts of the oxide layer 31 exposed when this nitride is removed are then etched to expose bare silicon. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Referring to FIG. 4c, a second field oxidation step is now performed by placing the slice in steam or dry oxygen at about 1000 degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 34 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide, then the oxide 31 is removed by etching and the exposed silicon cleaned. The gate oxide 19 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed, are patterned and etched at this point using photoresist; none are needed in the ROM array itself or the peripheral transistor shown.

As seen in FIG. 4d a layer 35 of polycrystalline silicon is deposited over the entire slice in a reactor using standard techniques. Since the implant for programming penetrates this layer of photoresist, the thickness is only about 3000 Angstroms, compared to about 5000 in the usual silicon gate process. This layer is doped with phosphorus by the later N+ diffusion to make it highly conductive. The polysilicon layer 35 is patterned by applying a layer of photoresist, exposing to ultraviolet light through a mask prepared for this purpose, developing, then etching both photoresist and exposed oxide. The remaining photoresist masks certain areas of the polysilicon to define the lines 14 and 15, and the gates of peripheral transistors, connections to contacts and other such parts of the circuit on the chip. The unmasked polycrystalline silicon is etched away, so the resulting structure seen in FIG. 4d includes a part of the remaining polysilicon layer 35 which provides what will be a gate 36 of an N-channel MOS transistor, the gates 11 in the ROM array, as well as the line 14. The thin oxide 19 underneath the gate 36 is the gate oxide of the transistor. These polysilicon and oxide layers also provide gate and gate oxide for all the other transistors in the ROM array, and gate and gate oxide for other peripheral transistors on the slice.

As will be seen in FIG. 4e, the next step in the process is deposition of a thin silicon nitride coating 37. This will be needed in subsequent processing to prevent unwanted etching. A thick layer 38 of silicon oxide is deposited by decomposition of silane at a low temperature, about 400 degrees C. This layer 38 insulates the metal level from the polycrystalline silicon level of interconnections, and is referred to as multilevel oxide.

Referring to FIG. 4f, the multilevel oxide layer 38 and its underlying nitride layer 37 are now patterned by a photoresist operation, exposing the entire ROM array area, as well as a contact area 39 for a metal-to-polysilicon contact and a contact area 40 for a metal-to-silicon contact. These are of course merely illustrative; metal contacts and interconnections are used in the periphery of the chip in the input buffers, decoders, sense amplifiers, substrate pump, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves a metal strip 41 connecting the source 42 of N-channel silicon gate transistor 43 to the contact area 39 at one end of the polysilicon X address line 14 as seen in FIG. 4f.

Up to this point in the process all slices are exactly the same as no programming has been done in the ROM array. The slices are processed routinely to this stage with no requirement for separate inventory controls and separate indentification of each lot. An inventory of slices finished up through metal patterning may be maintained for quick response to custom orders for ROM codes.

Figure 3A:
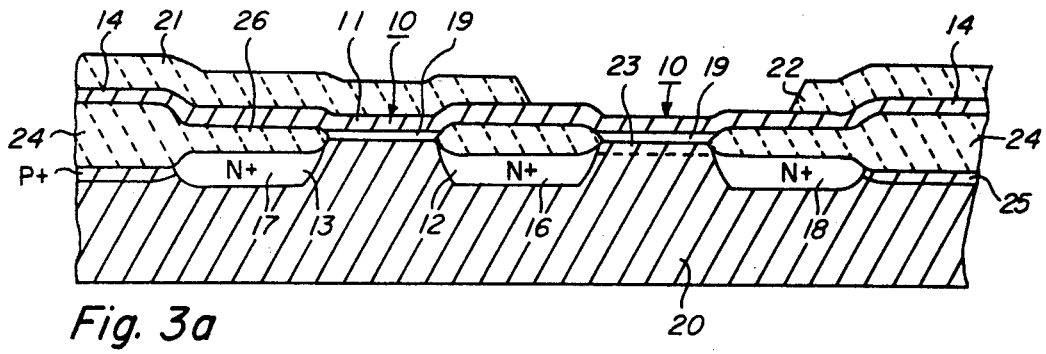
FIGS. 3a–3d are elevation views in section of the cell of FIG. 1, taken along the lines a-a, b-b, c-c, and d-d, respectively.
Figure 3B:
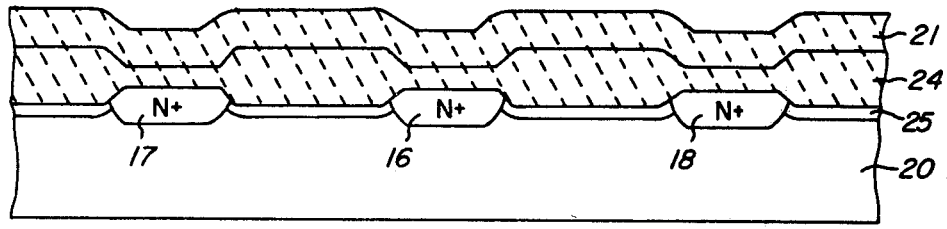
Figure 3C:
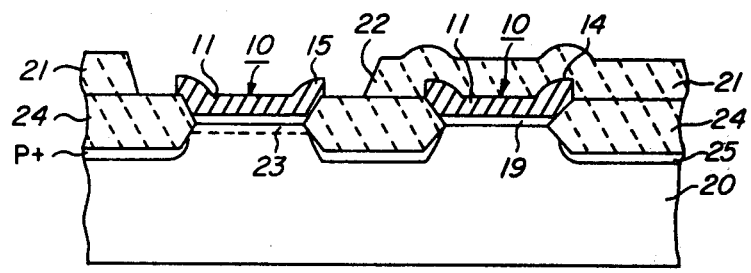
Figure 3D:
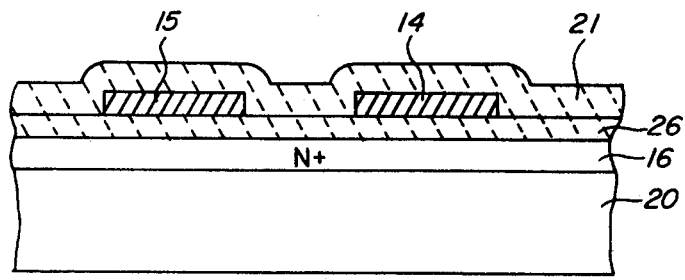

In accordance with the primary feature of the invention, referring to FIG. 3a, the ROM array is programmed by first depositing the post-metal-oxide or protective oxide layer 21 over the entire slice, then patterning it by a photoresist mask and etch sequence using a unique mask which defines the ROM code. An aperture 22 is defined over each cell 10 to be programmed as a "0", and each cell 10 to be a "1" is left covered. The slice is then subjected to a boron implant at about 180 Kev to a dosage of about $10^{13}$ per sq. cm. The energy level and dosage are dependent upon the thicknesses of the oxide layer 19 and the polysilicon gates 11, as well as the change in threshold desired. At this level, the ion implant penetrates the polycrystalline silicon gate 11 and gate oxide 19 to create an implanted region 23 in the channel area. This implant raises the threshold voltage above about 5 V. Since the part operates on a supply voltage Vdd of 5 V., the full logic 1 level will not turn on the transistor. The transistors covered by the oxide 21 will not be implanted so will retain the usual threshold voltage of about 0.8 V. It is important that the mask alignment for creating the apertures 22 for the programming mask is non-critical. The active channel area to be implanted has already been defined in previous processing step with thin gate oxide 19.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 17 and 18, and this line is connected via the Y decoder to the output. The Y lines usually would be precharged prior to an access cycle, so the selected line will conditionally discharge depending upon whether the selected bit at the intersection of the addressed X and Y lines is programmed a 1 or a 0.

The nitride coating 37 described above is for the purpose of preventing the etchant, which opens holes in the multilevel oxide 38 as described with reference to FIG. 4f, from removing parts of the oxide layer 26 in the exposed cell array area. As an alternative to the process described above wherein the nitride coating 37 is etched using the same mask as that for the multilevel oxide 38, a separate mask may be employed to remove all of the nitride coating 37 except over the cell array prior to deposition of the multilevel oxide. Or, in like manner, the nitride 37 may be patterned, prior to deposition of multilevel oxide 38, to expose only the contact areas 40 so nitride will remain in place for all of the remainder of the peripheral circuitry as well as the cell array. It is also possible to eliminate the nitride coating 37 altogether and rely upon the etch rate differential between deposited and thermal oxide; the deposited oxide etches much faster than thermally-grown oxide, so the thermal oxide in the cell array will not be disturbed a great deal.

In the above description, the protective oxide 21 is used as the implant mask for programming. This results in the cells programmed 0 in the array being left without a covering of thick protective oxide or overcoat 21. This might be detrimental after a long period of time in some environments. Instead, photoresist may be used for the implant mask, this being done prior to deposition of the protective overcoating 21. After programming using resist, the oxide 21 is deposited in the conventional manner, and patterned to expose only the bonding pads.

Instead of removing the multilevel oxide coating 38 from the entire cell array area as seen in FIG. 4f, it may be removed only over the gates of the transistor 10. This would provide additional protection.

The purpose of the ion implant for programming the cell array is to change the threshold voltage of some of the transistors 10 relative to the others, depending upon whether a 1 or a 0 is to be stored. A ROM cell can be either normally on or normally off when selected. The feature of this invention can be used in either P-channel or N-channel ROMs, so, depending on channel type and whether the cells are to be normally on or normally off when selected, the proper type of dopant for ion implant is determined. In the embodiment described in detail above, a boron implant is used to increase the threshold voltage such that a transistor 10 is off when selected. The normally on device can be either enhancement or depletion mode. In another example, such as the series ROM of U.S. Pat. No. 4,059,826 mentioned above, the ion implant would lower the threshold to depletion mode.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A read only memory array comprising: a plurality of memory cells formed at a face of a silicon body in an array of rows and columns; each memory cell including an insulated gate field effect transistor having a source, a drain and a gate, the gate being insulated from the silicon by a gate insulator; a plurality of other insulated gate field effect transistors formed at said face of the silicon body in an area peripheral to the array; a first thick silicon oxide insulating coating only on said area peripheral to the array covering the other field effect transistors except at contact areas; interconnections in the peripheral areas formed by metal strips on top of said first silicon oxide coating and connected to the other field effect transistors at said contact areas; a second thick insulating coating on said face covering the array and the peripheral areas over the metal strips with apertures formed in the second insulating coating over only selected ones of the memory cells; and impurity implanted regions underlying the gate and gate insulator for said selected ones of the memory cells to alter substantially the threshold of the transistors of such cells compared to the transistors of memory cells other than the selected ones.

* * * * *